(12) United States Patent
Coustou et al.

(10) Patent No.: US 7,782,155 B2
(45) Date of Patent: Aug. 24, 2010

(54) CIRCULATOR TYPE MONOLITHIC DEVICE

(75) Inventors: Anthony Coustou, Alvignac (FR); Robert Plana, Verfeil (FR)

(73) Assignee: Centre National de la Recherche Scientifique, Paris (FR)

( * ) Notice: Subject to any disclaimer, the term of this patent is extended or adjusted under 35 U.S.C. 154(b) by 68 days.

(21) Appl. No.: 12/278,083

(22) PCT Filed: Feb. 2, 2007

(86) PCT No.: PCT/FR2007/050742

§ 371 (c)(1),
(2), (4) Date: Dec. 12, 2008

(87) PCT Pub. No.: WO2007/090982

PCT Pub. Date: Aug. 16, 2007

(65) Prior Publication Data

US 2009/0302964 A1 Dec. 10, 2009

(30) Foreign Application Priority Data

Feb. 2, 2006 (FR) .................................. 0650365

(51) Int. Cl.
*H03H 7/38* (2006.01)
(52) U.S. Cl. ............................ 333/32; 333/109; 333/25
(58) Field of Classification Search .................. 333/33, 333/32, 25, 26, 109, 110, 1.1, 24.2, 100; 455/292
See application file for complete search history.

(56) References Cited

U.S. PATENT DOCUMENTS 5,697,088 A * 12/1997 Gu .............................. 455/307

FOREIGN PATENT DOCUMENTS

| DE | 28 07 813 B1 | 6/1979 |
| DE | 195 08 429 A1 | 9/1996 |
| EP | 1 209 756 A1 | 5/2002 |

OTHER PUBLICATIONS

French Search Report dated Sep. 24, 2007.

* cited by examiner

*Primary Examiner*—Stephen E Jones
(74) *Attorney, Agent, or Firm*—Howard IP Law Group, PC

(57) ABSTRACT

A monolithic circulator, intended to be connected to an antenna for transmitting and receiving high-frequency signals includes a differential amplifier adapted to provide a signal on an output of the circulator. The amplifier has a first and a second input and an output. First and second 3dB couplers each have first, second, and third access terminals respectively. The second terminals of the first and second couplers are connected to an input E of the circulator. Each third terminal is connected to the first and second inputs of the amplifier respectively. The first terminals are respectively intended to be connected to the antenna and to a charge element having an impedance close to that of the antenna.

18 Claims, 6 Drawing Sheets

CIRCULATOR TYPE MONOLITHIC DEVICE

This application is the national stage application under 35 U.S.C. §371 of the International Application No. PCT/FR2007/050742 and claims the benefit of Int'l. Application No. PCT/FR2007/050742, filed Feb. 2, 2007 and French Application No. 06/50365, filed Feb. 2, 2006, the entire disclosures of which are incorporated herein by reference in their entireties.

Field of the Invention

The present invention relates to circulators belonging to a monolithic device such as an integrated circuit. The present invention more specifically relates to circulators used in radio-frequency identification systems.

Discussion of Prior Art

FIG. 1 is a diagram of a radio-frequency identification system. A terminal 1 provided with an antenna 2 enables identifying a transponder device 3. Transponder device 3 may be a tag glued on an item or a badge carried by a person. Terminal 1 may be fixed or mobile according to the envisaged use.

Transponder device 3 can be identified as follows. Terminal 1 transmits an electromagnetic signal Tx via antenna 2. When transponder device 3 receives electromagnetic signal Tx, it transmits in return an electromagnetic signal Rx, which is received by antenna 2, then processed by terminal 1.

Electromagnetic signals Tx and Rx being transmitted and received by a same antenna, terminal 1 must be equipped with a device enabling "separation" of the two signals. For this purpose, a so-called circulator device is generally used.

FIG. 2 is a diagram of known circulator example. It comprises a capacitor 10 placed between an input E and the ground. It further comprises two coils 11 and 12 having one side connected to input E and the other sides respectively connected to a node n1 and to a node n2. Capacitors 13 and 14 are placed respectively between node n1 or n2 and the ground. A resistor 15 is placed between nodes n1 and n2. The inputs of a low-noise differential amplifier LNA 20 are connected to nodes n1 and n2. Differential amplifier LNA 20 provides a signal on an output S. Antenna 2 for transmitting/receiving electromagnetic signals Tx and Rx is connected to node n1. Further, a charge element 21 is placed between node n2 and the ground. Impedance Zi of charge element 21 is equal to the impedance of antenna 2. This circulator is in fact formed of a lumped-element Wilkinson divider followed by a differential amplifier.

In a transmission, terminal 1 provides an electric signal on input E of the circulator. This signal propagates to antenna 2 where an electromagnetic signal is transmitted. It should be noted that the electric signal also propagates through coil 12 to node n2. The electric signals received on the inputs of differential amplifier 20 are theoretically identical in amplitude and in phase. The signal provided by differential amplifier 20 is then zero or very low.

When a signal Rx is transmitted by transponder device 3, antenna 2 picks up this signal and transmits it to node n1. This signal further propagates through the circulator to reach node n2 where it arrives strongly attenuated. The circulator components have values such that the signals present on the inputs of differential amplifier 20 are in phase opposition. The differences between these two signals are amplified and transformed by amplifier 20 which provides on output S of the circulator a recovery of signal Rx.

A disadvantage of the above-described circulator is that the power of a signal Tx provided by terminal 1 must remain low to avoid disturbing the operation of differential amplifier LNA 20. In practice, this limitation of the transmission power of terminal 1 prevents the detection of transponder devices located more than 10 cm away from terminal 1.

Further, the separating power of the circulator, in other words, its capacity to enable recognizing a signal Rx of much lower power than a signal Tx transmitted in parallel, is limited. Accordingly, the power of signal Rx must not be too low with respect to that of signal Tx. For this purpose, either the transponder device must be close to terminal 1, or the transponder device must be provided with an internal battery. Now, the use of an internal battery considerably increases the cost and the size of transponders such as tags or badges. Further, the electric consumption of transponders being generally high and the storage capacity of batteries being low, the lifetime of transponders is often limited.

Moreover, the separating power of the circulator is, in practice, much lower than its "theoretical" power, since the impedance of antenna 2 significantly varies according to the conditions of use. The impedance of the antenna especially depends on the presence of electric conductive elements close to the antenna.

SUMMARY OF THE INVENTION

An object of the present invention is to provide a circulator which enables transferring to an antenna signals of high power to be transmitted without disturbing the reception by this same antenna of signal of much lower power.

Another object of the present invention is to provide such a circulator which has an unchanged separating power whatever the impedance of the antenna to which it is connected.

Another object of the present invention is to provide such a circulator which can be made monolithically.

Another object of the present invention is to provide such a circulator which enables transmitting and receiving electromagnetic signals having a frequency of a few GHz.

An embodiment of the present invention provides a monolithic circulator, intended to be connected to an antenna for transmitting and receiving high-frequency signals, comprising: a differential two-input amplifier capable of providing a signal on an output of the circulator, and two 3-dB couplers each comprising first, second, and third access terminals, the second terminals being connected to an input E of the circulator, each third terminal being connected to an input of the amplifier, the first terminals being respectively intended to be connected to the antenna and to a charge element having an impedance close to that of the antenna.

According to an embodiment of the above-mentioned circulator, each coupler comprises a resistor and a coil with a midpoint, placed in parallel between its first and third terminals, the two parts of each coil with a midpoint being magnetically coupled, the midpoint of a coil of a coupler being connected to its first terminal.

According to an embodiment of the above-described circulator, each coupler further comprises a capacitor in parallel on the resistor and the coil with a midpoint of the considered coupler.

According to an embodiment of the above-mentioned circulator, the impedance of the antenna is close to that of a resistance of value R, the value of the resistances of each coupler being approximately equal to four times R, the impedance of an input of the differential amplifier being approximately equal to twice R, the output impedance of a circuit connected on the input of the circulator being approximately equal to twice R.

According to an embodiment of the above-described circulator, the impedance of the charge element is settable.

According to an embodiment of the above-described circulator, the circulator comprises a control circuit capable of modifying the impedance of the charge element according to the voltage measured at the output of the differential amplifier.

According to an embodiment of the above-described circulator, the charge element comprises a first resistor and a first voltage source in series between the ground and a first intermediary node between the cathodes of two first varactor-type diodes, a second resistor and a second voltage source in series between the ground and a second intermediary node between the cathodes of two second varactor-type diodes, the anode of one of the first diodes being grounded via a third resistor, the anode of one of the second diodes being grounded, the other one of the second diodes being grounded via a fourth resistor, a coil being placed between the anode of the other one of the first diodes and the anode of the other one of the second diodes.

According to an embodiment of the above-described circulator, the control circuit comprises a first block assembly which receives the output of the circulator and which is connected to first and second control loops, the first block assembly comprising a device for extracting the amplitude of the output signal of the circulator, followed by a low-pass filter and a differentiating device, each control loop comprising the following elements: a dividing block receiving on a numerator input the output of the differentiating device, the output of the dividing block being connected to a positive terminal of a comparator, the output of the comparator being connected to a stabilizing device having its output connected to the input of an integrating block, a differentiating block being placed between the output of the integrating block and a denominator input of the dividing block, the second loop further comprising a buffer block placed between its comparator and its stabilizing device and receiving the output of the differentiating block of the first loop, the output of the buffer block being equal to the output of the comparator of the second loop or to zero according to whether the output of the differentiating block of the first loop is respectively zero or non-zero, the outputs of the integrating blocks of the first and second loops respectively providing voltages equal to the voltages applied by the first and second voltage sources of the charge element.

According to an embodiment of the above-mentioned circulator, the differentiating device is formed of a capacitor and of a resistor in series placed between the output of the low-pass filter and the ground, the intermediary node between the capacitor and the resistor being connected to the N inputs of the dividing blocks of the control loops, the stabilizing device of each control loop comprises first and second Schmitt triggers, the input of the first trigger being connected to the comparator of the considered loop, a first resistor placed between the triggers, a capacitor placed between the input of the second trigger and the ground, and a second resistor placed between the output of the second trigger and the input of the integrating block of the considered control loop, the differentiating block of each control loop comprises a capacitor and a resistor in series between the input of the block and the ground, the intermediary node between the capacitor and the resistor forming the block output, and the integrating block of each control loop comprises a differential amplifier as well as a capacitor and a resistor placed in parallel between the output and the negative input of the differential amplifier, the positive and negative terminals of the amplifier being respectively connected to ground and to the output of the stabilizing device of the considered loop.

The present invention also provides a terminal for receiving and transmitting electromagnetic signals comprising a circulator such as those described hereabove, the circulator being connected to an antenna.

BRIEF DESCRIPTION OF THE DRAWINGS

The foregoing objects, features, and advantages of the present invention, as well as others, will be discussed in detail in the following non-limiting description of specific embodiments in connection with the accompanying drawings, among which.

DETAILED DESCRIPTION

Figure 5:
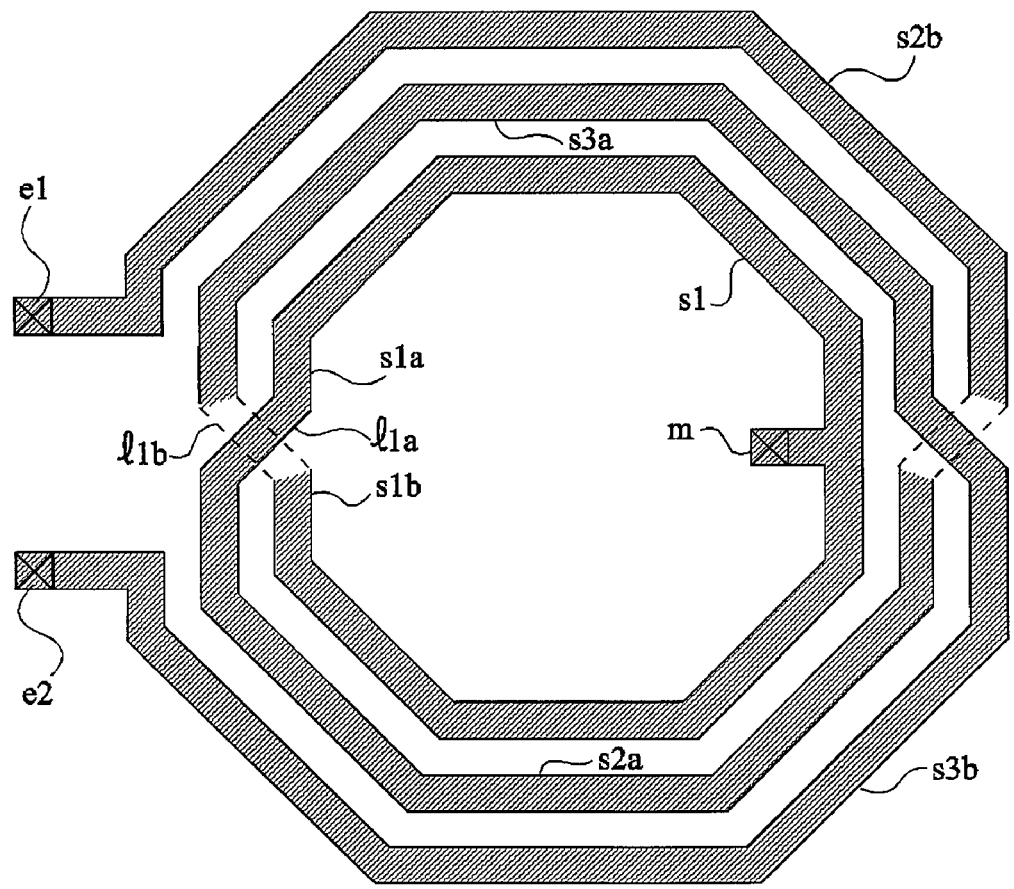
FIG. 5 is a top view of an example of a coil with a midpoint used in the circulator shown in FIG. 4.

For clarity, the same elements have been designated with the same reference numerals in the different drawings and, further, as usual in the representation of integrated circuits, FIG. 5 is not drawn to scale.

Figure 3:
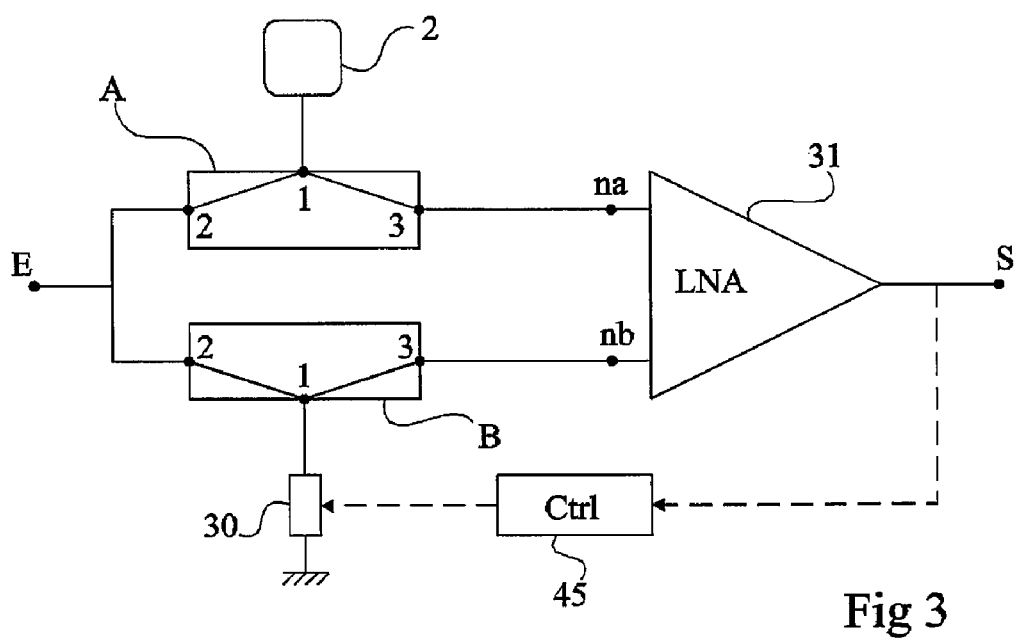
FIG. 3 is a diagram of a circulator according to the present invention.

FIG. 3 is a diagram of a circulator according to the present invention. The circulator comprises two couplers A and B, each comprising 3 access terminals numbered 1, 2, and 3. Access terminal n°1 of coupler A is connected to an antenna 2. Access terminal n°1 of coupler B is connected to a charge element 30 having an impedance close to that of antenna 2. Access terminals n°2 of couplers A and B are connected to an input E of the circulator. Access terminals n°3 of couplers A and B are respectively connected to inputs na and nb of a low-noise differential amplifier LNA 31. The output of amplifier 31 is connected to an output S of the circulator.

The couplers used in the circulator according to the present invention are 3 dB-type couplers. 3 dB couplers are such that a signal reaching access terminal n°1 propagates to each of terminals n°2 and n°3 and that a signal arriving on access terminal 2 only propagates to terminal n°1. In an ideal 3 dB coupler, no signal propagates between terminals n°2 and n°3.

Various types of 3 dB couplers may be used. Coupled lines and a Wilkinson divider are examples thereof. An example of a coupler formed from a coil with a midpoint having two magnetically-coupled portions is described hereafter.

When a terminal comprising a circulator according to the present invention wants to transmit an electromagnetic signal Tx, it presents an adequate signal tx on input E of the circulator. Signal tx propagates between access terminals n°2 and n°1 of coupler A to antenna 2. Antenna 2 then transmits electromagnetic signal Tx.

Since existing couplers are not perfect, during this transmission, part of electric signal tx propagates through the couplers, between nodes n°2 and n°3, to nodes na and nb which receive two "parasitic" signals txa and txb. The power of parasitic signals txa and txb is however much smaller than that of electric signal tx present on input E. This strong power reduction enables not disturbing the operation of the differential amplifier. Further, parasitic signals txa and txb are of same amplitude and in phase. Their impact on the value of the signal provided at output S of the circulator is thus negligible. This impact is all the more negligible as the common-mode rejection factor of differential amplifier 31 is high.

Figure 1:
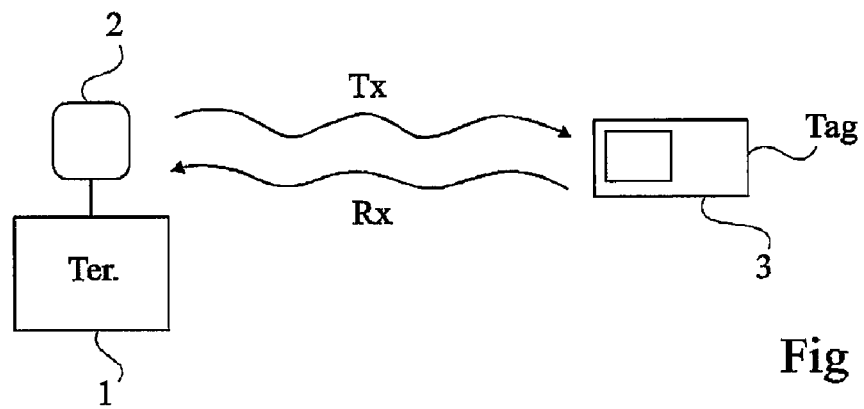
FIG. 1 is a diagram, previously described, illustrating a radio-frequency identification system.
Figure 2:
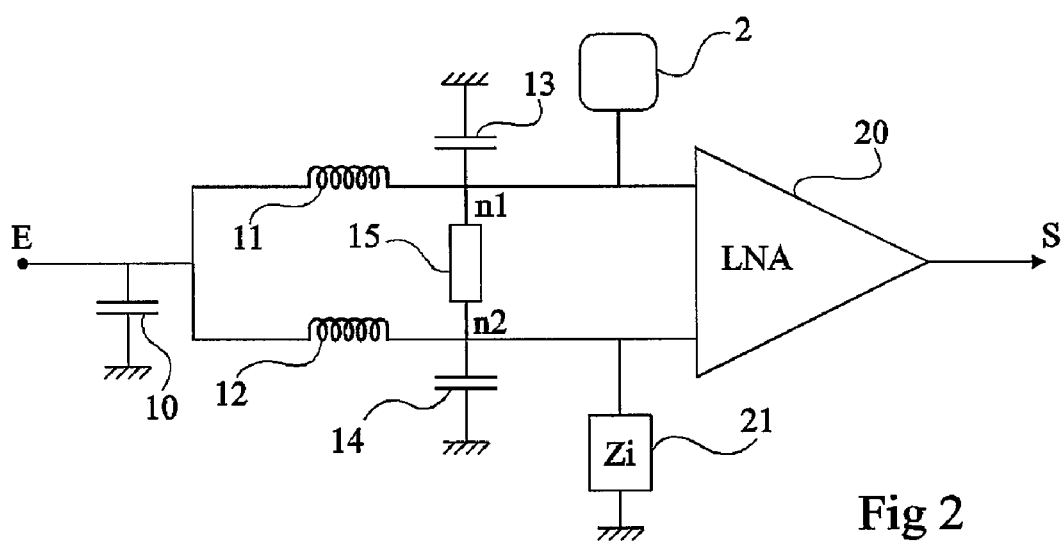
FIG. 2 is a diagram of a known circulator, previously described.

When an electromagnetic signal Rx is transmitted by transducer device 3 (of FIG. 1) and received by antenna 2, an electric signal rx "enters" the circulator at the level of access terminal n°1 of coupler A. Signal rx propagates to access terminal n°3 of coupler A to reach input na of amplifier 31 in the form of a signal rxa. Signal rx also propagates to access terminal n°2 of coupler A to join access terminal n°2 of coupler B. A signal of very low power then comes out through access terminal n°3 of coupler B to reach input nb of amplifier 31 in the form of a signal rxb. Signals rxa and rxb are in phase opposition, the amplitude of signal rxb being much lower than that of signal rxa. The differential amplifier then provides on output S a signal corresponding to a recovery of the received signal rx.

An advantage of the circulator according to the present invention is that it enables transmitting electromagnetic signals of high power without disturbing the operation of the differential amplifier. Thus, a terminal comprising a circulator according to the present invention may receive electromagnetic signals of very low power and thus detect transducer devices relatively distant from the terminal.

Further, to be able to receive and transmit signals having a frequency on the order of one GHz, known circulators must comprise components having very high inductance, capacitance and resistance values. This is incompatible with an embodiment of a circulator in the form of a monolithic device.

Conversely, many types of 3 dB couplers may be formed from a set of "integrable" components, that is, components of reasonable size to be placed in an integrated circuit.

An advantage of a circulator according to the present invention thus is that it can be made monolithically even when the signal transmit and receive frequency is high, on the order of one GHz.

Figure 4:
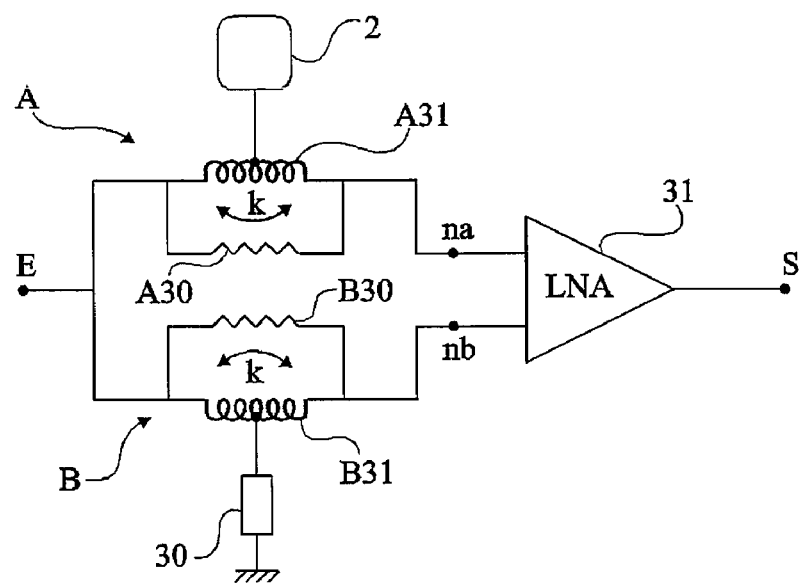
FIG. 4 is an embodiment of a circulator according to the present invention.

FIG. 4 is a diagram of an embodiment of a circulator according to the present invention. Each coupler A and B comprises a resistor A30, B30, and a coil with a midpoint A31, B31, placed in parallel between input E of the circulator and an input na or nb of differential amplifier 31. The midpoint of coil A31 is connected to antenna 2. The midpoint of coil B31 is connected to charge element 30. Coils A31 and B31 with a midpoint each comprise two magnetically-coupled coil portions. For each coil with a midpoint, the first portion is placed between input E and the coil midpoint and the second portion is placed between the midpoint and an input na or nb of amplifier 31. The total inductance of the coil is equal to L, the first and second portions having inductances respectively equal to L/2.

FIG. 5 is a top view of an example of a coil with a midpoint having two magnetically-coupled portions. Such a coil with a midpoint is currently used in integrated circuits. It is generally placed above a semiconductor wafer housing semiconductor components, in the interconnection network of the integrated circuit. The interconnection network comprises several metallization levels separated with insulating layers. The coil with a midpoint shown in FIG. 5 is formed of metal lines mainly placed on a same metallization level N, a few metal lines being placed on a lower metallization level, n−1. An internal spiral s1 of substantially octagonal shape is formed on metallization level N. The two ends s1a and s1b of spiral s1 are close to each other to the left of the drawing. End s1a is connected to an external spiral s2 mainly formed on level N and having its end, placed to the left of the drawing, forming an end e1 of the coil. Similarly, end s1b of internal spiral s1 is connected to an external spiral s3 formed on level N and having its end, placed to the left of the drawing, forming an end e2 of the coil. End s1a of spiral s1 is connected to spiral s2 by a connection coil portion 11a placed at level N. As to end s1b, it is connected to spiral s3 by a "tunnel"-shaped connection coil portion 11b comprising two conductive vias and a portion placed at level N−1 under connection portion 11a, transversely thereto. Each of spirals s2 and s3 comprises a half-spiral s2a, s3a, close to spiral s1 and extending from the left to the right of the drawing, respectively under and above spiral s1. The other half-spirals s2b and s3b of spirals s2 and s3 extend from the right to the left of the drawing, respectively above and under half-spirals s3a and s2a. Half-spirals s3a and s3b of spiral s3 are connected by a portion of connection coil 13 placed at level N. Half-spirals s2a and s2b of spiral s2 are connected by a "tunnel"-shaped connection coil portion 12 comprising two conductive vias and a portion placed at level N−1 under connection portion 13, transversely thereto. The middle of the portion of spiral s1 located to the right of the drawing is connected to a contact pad forming a midpoint m.

The first coil portion is formed of spiral s2 and of half of spiral s1. The second portion of the coil is formed of spiral s3 and of half of spiral s1. The two coil portions are interlaced and magnetically coupled.

In the circulator embodiment shown in FIG. 4, the use of coils with a midpoint comprising two magnetically-coupled portions enables forming an insulation between input E of the circulator and inputs na and nb of amplifier 31. It should however be noted that the insulation between input E and amplifier 31 is achieved all the better as the elements connected to each of coils A31 and B31 have impedances of predetermined values such as defined hereafter.

Figure 6:
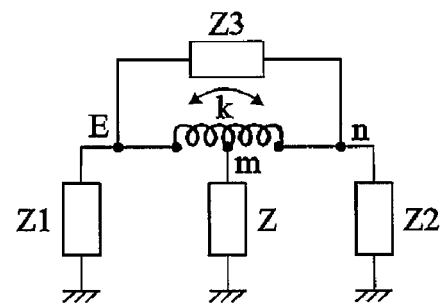
FIG. 6 is an equivalent electric diagram of a portion of the circulator shown in FIG. 4.

FIG. 6 is an equivalent electric diagram of the elements connected to one of coils A31 and B31. Midpoint m of the coil is connected to antenna 2 or to charge element 30, each of which has an impedance Z. One end of the coil is connected to input E of the circulator, which is connected to a circuit of the terminal such as a power amplifier having an output impedance of value Z1. The other coil end is connected to an input amplifier na or nb, generally called n in this equivalent diagram. Each input of amplifier 31 has an impedance Z2. Further, the coil ends are connected via a "matching" circuit having an impedance Z3. This matching element comprises, among others, resistor A30 or B30 shown in FIG. 4.

For the insulation to be "perfect", impedances Z1 and Z2 must be identical and equal to twice impedance Z (Z1=Z2=2*Z). Further, impedance Z3 must be equal to four times Z (Z3=4*Z).

Impedance Z of antenna 2, fluctuating though it may be, is always relatively close to that of a resistor R having a 50-ohm value. Impedances Z1 and Z2 must thus be substantially equal to 2*R, that is, 100 ohms. Impedance Z3, in other words, resistance A30 or B30 of each branch, must be substantially equal to 4*R, that is, 200 ohms.

Figure 7:
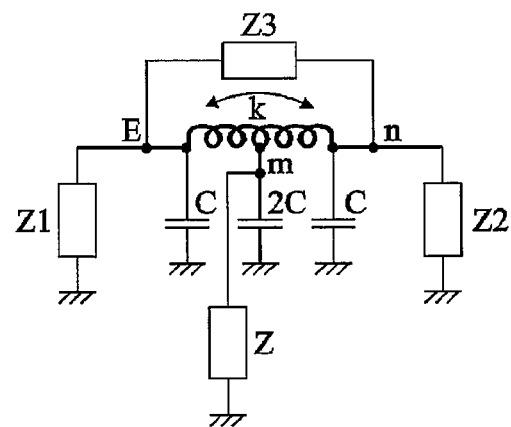
FIG. 7 is a more detailed equivalent electric diagram of the portion of the circulator shown in FIG. 4.

FIG. 7 is an equivalent electric diagram more detailed than that shown in FIG. 6, which takes into account the parasitic elements of a coil with a midpoint of a monolithic device. The parasitic capacitive elements of such a coil may be modeled as follows. A capacitor of capacitance C is placed between each end of the coil and the ground and a capacitor having a capacitance equal to 2*C is placed between the coil midpoint and the ground. The value of capacitance C is a function of the size and of the shape of the used coil. Generally, the higher the coil inductance, the higher capacitance C.

Input E, midpoint m, and input n are then connected to elements respectively having an impedance Z1', Z', and Z2'. Impedance Z1' is formed of impedance Z1 in parallel with a capacitor of capacitance C. Similarly, impedance Z2' is formed of impedance Z2 in parallel with a capacitor of capacitance C. Impedance Z' is formed of impedance Z in parallel with a capacitor of capacitance 2*C.

The relations providing an electric insulation between input E and the amplifier then are: Z1'=Z2'=2*Z' and Z3=4*Z'.

For the second relation to be fulfilled, a capacitor of capacitance C/2 must be placed in parallel on each resistor A31, B31. Impedance Z3 then is that of a resistor of value 4*R and of a capacitor of capacitance C/2 in parallel.

The first relation is fulfilled without modifying previously defined impedances Z1 and Z2. In other words, impedances Z1 and Z2 are equal to resistance R corresponding to the "average" equivalent impedance of the antenna.

Figure 8:
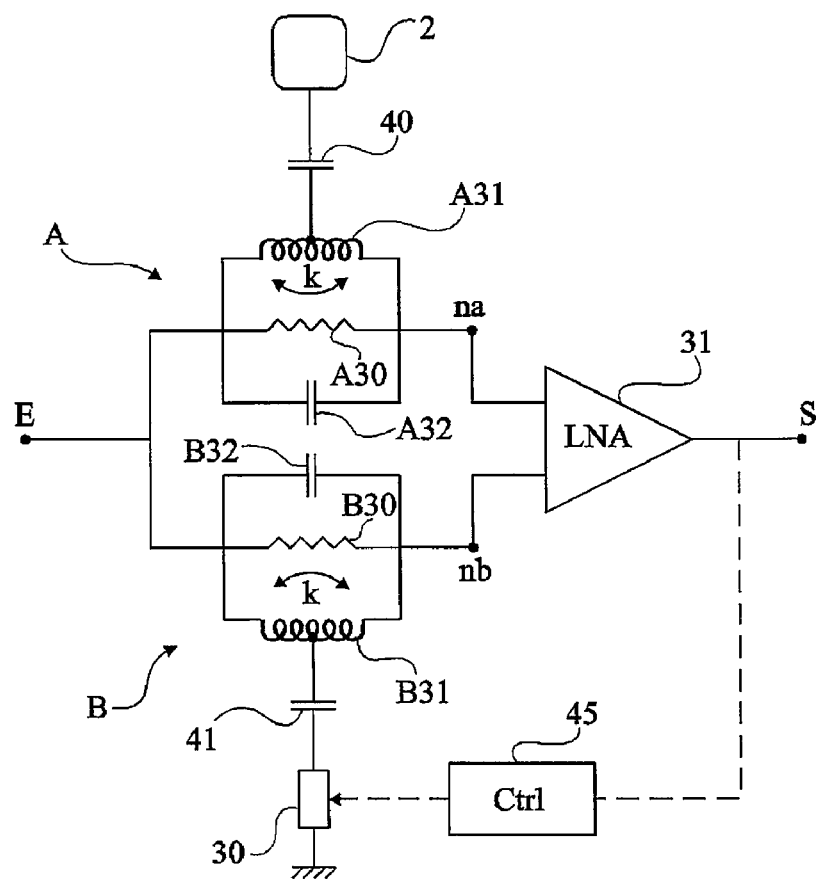
FIG. 8 is a diagram of an alternative embodiment of the circulator shown in FIG. 4.

FIG. 8 is a diagram of an alternative embodiment of the circulator shown in FIG. 4. In addition to the elements shown in FIG. 4, the circulator comprises in each coupler A and B, a capacitor A32, B32 in parallel with resistor A30, B30 and coil A31, B31. The capacitance of each capacitor A32, B32 is set as described hereabove according to the stray capacitances of each of coils A31 and B31. The circulator further comprises a capacitor 40 placed between the midpoint of coil A31 and antenna 2. Capacitor 40 is used as a connection capacitor. Symmetrically, a capacitor 41, of same capacitance as capacitor 40, is placed between the midpoint of coil B31 and charge element 30.

It should further be noted that, in a transmission, the second portion of each of coils A31 and B31 conducts an unwanted magnetizing current which propagates to the input of amplifier 31. This magnetizing current is inversely proportional to inductance value L of the coil and inversely proportional to the frequency of the signal propagating through the coil. For a frequency on the order of 2.4 GHz, a ratio of 20 dB between the power of a parasitic signal txa or txb at the input of amplifier 31 and the power of a signal tx on input E may be obtained by using coils A31 and B31 having an inductance of a few nH.

According to a perfected embodiment of the present invention, charge element 30 has a variable impedance Zc which is "dynamically" adjustable, that is, adjustable during periods of use of the circulator. Impedance Zc is adjusted to be as close as possible to the impedance of antenna 2. To dynamically adjust impedance Zc of the charge element, a control device 45 shown in FIGS. 3 and 8 may be used, which modifies, if need be, impedance Zc according to the voltage measured at the output of differential amplifier 31. Control device 45 thus enables forming a loop for controlling impedance Zc of the charge element. An example of a charge element of variable impedance Zc and of an associated control device 45 are described in further detail hereafter.

Figure 9:
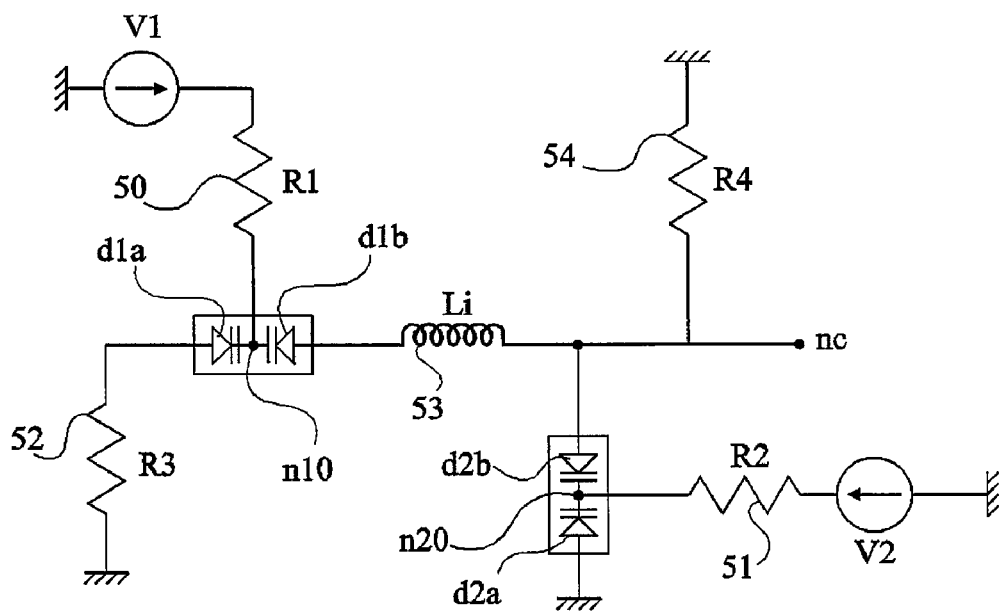
FIG. 9 is a diagram of an example of a charge element that can be used in a circulator according to the present invention.

FIG. 9 is a diagram of an embodiment of charge element 30 of the circulator shown in FIG. 3. It comprises a voltage source V1 and a resistor 50, of value R1, placed in series between the ground and an intermediary node n10 connecting the cathodes of a pair of VARACTOR-type diodes d1a and d1b. VARACTOR-type diodes are also known as variable-capacitance diodes. Similarly, a voltage source V2 and a resistor 51, of value R2, are placed in series between the ground and an intermediary node n20 connecting the cathodes of a pair of VARACTOR-type diodes d2a and d2b. The anode of diode d1a is grounded via a resistor 52, of value R3. The anode of diode d2a is grounded. A coil 53, of inductance Li, is placed between the anodes of diodes d1b and d2b. A resistor 54, of value R4, is placed between the ground and the anode of diode d2b. The anode of diode d2b, resistor 54, and coil 53 are connected to a connection node nc intended to be connected to terminal n°1 of coupler B of the circulator shown in FIG. 3.

Equivalent capacitance Cd1 of diode pair d1a/d1b is a function of voltage V1. The higher voltage V1, the lower capacitance Cd1. Similarly, equivalent capacitance Cd2 of diode pair d2a/d2b is a function of voltage V2. The higher voltage V2, the lower capacitance Cd2.

Impedance Zc of charge element 30 may be defined as a complex number Zc=zr+j*zi, where j is the complex variable and zr and zi are real numbers corresponding to the real and imaginary parts of Zc. At the first order, real part zr is set by voltage V2 and imaginary part zi is set by voltage V1.

As a non-limiting indication, the characteristics of the components of the charge element are the following:

resistance R1: 1.8 kOhms;
resistance R2: 1.8 kOhms;
resistance R3: 20 Ohms;
resistance R4: 4 kOhms;
inductance Li: 3.43 nH;
Cd1 for V1=0.2 and 4 V: 7 pF;
Cd1 for V2=0.2 and 4 V: 3.81 pF.

Those skilled in the art may devise other charge elements than that shown in FIG. 9. A charge element having an impedance Zc which has a very low sensitivity to the power variations of the signal applied thereacross will be used to avoid problems of distortion of signals propagating through the circulator.

An advantage of the charge element shown in FIG. 9 is that its impedance Zc has a very low sensitivity to power variations of the signal applied to node nc.

An example of a control device 45 that can be used in association with the charge element shown in FIG. 9 to form a loop for controlling impedance Zc of the charge element according to the impedance variations of antenna 2 is described hereafter.

Figure 10:
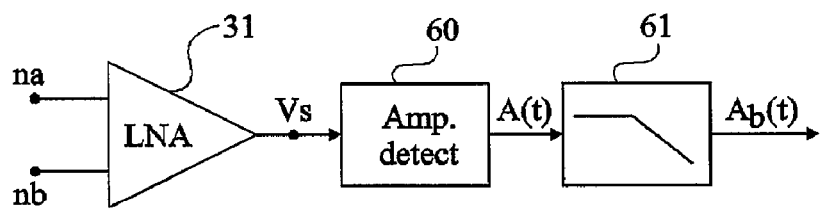
FIG. 10 is a diagram illustrating a portion of a device of the circulator shown in FIG. 8.

FIG. 10 is a diagram illustrating a portion of control device 45. A calculation device 60 receives voltage Vs(t) provided by LNA amplifier 31 on output S of the device and provides a voltage A(t) corresponding to the amplitude of voltage Vs. A low-pass filter 61 "extracts" the low-frequency portion of signal A(t) and provides a voltage $A_b(t)$. Voltage $A_b(t)$ is a function of the values of voltages V1 and V2 applied in charge element 30. Thus, voltage $A_b$ may be defined by means of a function F having two input variables, voltages V1 and V2, $A_b = F(V1, V2)$.

Figure 11:
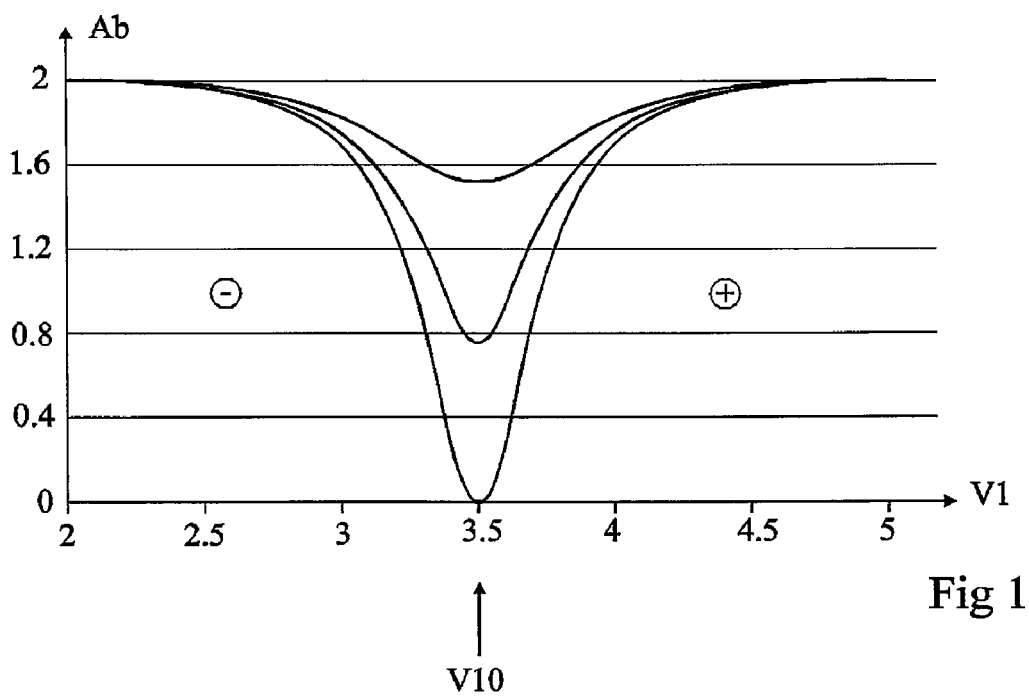
FIG. 11 is a diagram illustrating the level of the output signal of the circulator shown in FIG. 3 according to the voltage applied by a voltage source of the charge element shown in FIG. 9.

FIG. 11 is a diagram indicating the value of voltage $A_b$ according to voltage V1, for different values of voltage V2. It can be seen that, whatever voltage V2, voltage $A_b$ decreases when voltage V1 increases from 0 V to a value V10, equal to 3.5 V in this example, and that voltage $A_b$ increases when voltage V1 increases from value V10 to a maximum possible value for V1. Accordingly, the derivative of voltage $A_b$ with respect to V1 is negative when V1 is smaller than V10, and positive when V1 is greater than V10.

The variations of voltage $A_b$ according to voltage V2 for different values of voltage V1 are identical to those described previously.

The setting of voltages V1 and V2 by control device 45 is performed in two steps. It is started by adjusting one of the two voltages, for example, voltage V1, without changing the other. The second voltage, voltage V2 in our example, is then adjusted, voltage V1 being set. The aim of the setting is to obtain a zero voltage $A_b$ in the end.

Figure 12:
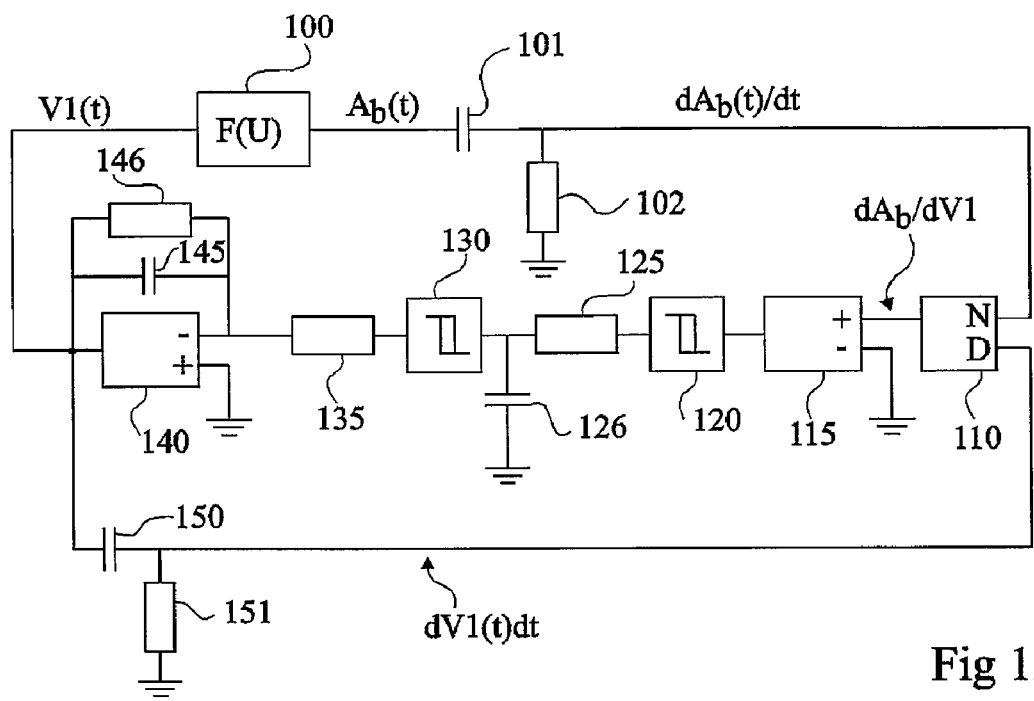
FIG. 12 is a diagram illustrating a system for controlling the impedance of the charge element shown in FIG. 9.

FIG. 12 is a diagram illustrating a portion of control device 45, shown in FIG. 3, enabling setting voltage V1. A block 100 comprises the elements of the circulator other than control device 45 as well as calculation device 60 and low-pass filter 61 of control device 45. Block 100 modifies voltage $A_b$ according to the variations of voltage V1 according to previously-described function F. Voltage $A_b$ and voltage V1 vary along time according to the impedance variations of antenna 2, notation $A_b(t)$ and V1(t) enabling taking such time variations into account.

Control device 45 comprises the following elements. An electrode of a capacitor 101 is connected to the output of low-pass filter 61 shown in FIG. 10. A resistor 102 is placed between the other electrode of capacitor 101 and the ground. The intermediary node between capacitor 101 and resistor 102 is connected to a "numerator" input N of a dividing block 110. The output of dividing block 110 is connected to a positive terminal of a comparator block 115 having its negative terminal connected to ground. The output of comparator block 115 is connected to a Schmitt trigger block 120. The output of block 120 is connected to a terminal of a resistor 125. A capacitor 126 is placed between the other terminal of resistor 125 and the ground. The intermediary node between resistor 125 and capacitor 126 is connected to the input of a block of Schmitt trigger type 130. The output of block 130 is connected to a terminal of a resistor 135. The other terminal of resistor 135 is connected to a negative input of an amplifier 140 having its positive input connected to ground. A capacitor 145 and a resistor 146 are placed in parallel between the output and the negative input of amplifier 140. The output of amplifier 140 provides voltage V1(t) which is applied in charge element 30 included in block 100. The output of amplifier 140 is connected to an electrode of a capacitor 150. A resistor 151 is placed between the ground and the other electrode of capacitor 150. The intermediary node between capacitor 150 and resistor 151 is connected to a "denominator" input D of dividing block 110.

Capacitor 101 and resistor 102 form a differentiating device, the value of the voltage provided on input N of dividing block 110 corresponding to the time derivative of voltage $A_b$ ($dA_b(t)/dt$).

Capacitor 150 and resistor 151 form another differentiating device. The value of the voltage provided on input D of dividing block 110 corresponds to the time derivative of voltage V1 ($dV1(t)/dt$).

The value provided at the output of dividing block 110 corresponds to the derivative of voltage $A_b$ with respect to voltage V1 ($dA_b(t)/dV1$).

The value provided at the output of comparator 115 indicates the sign of the derivative of voltage $A_b$ with respect to voltage V1.

Resistor 125 and capacitor 126 form a low-pass filter. These low-pass filters and the blocks of Schmitt trigger type 120 and 130 are used to stabilize the control loop.

Amplifier 140, capacitor 145, and resistors 135 and 146 form an integrating device. When the sign of $dA_b/dV1$ is positive, the integrating device decreases voltage V1 and conversely.

When the time derivative of voltage $A_b$ is zero, $dA_b(t)/dt=0$, voltage V1 is set. It is then proceeded to the setting of voltage V2.

Figure 13:
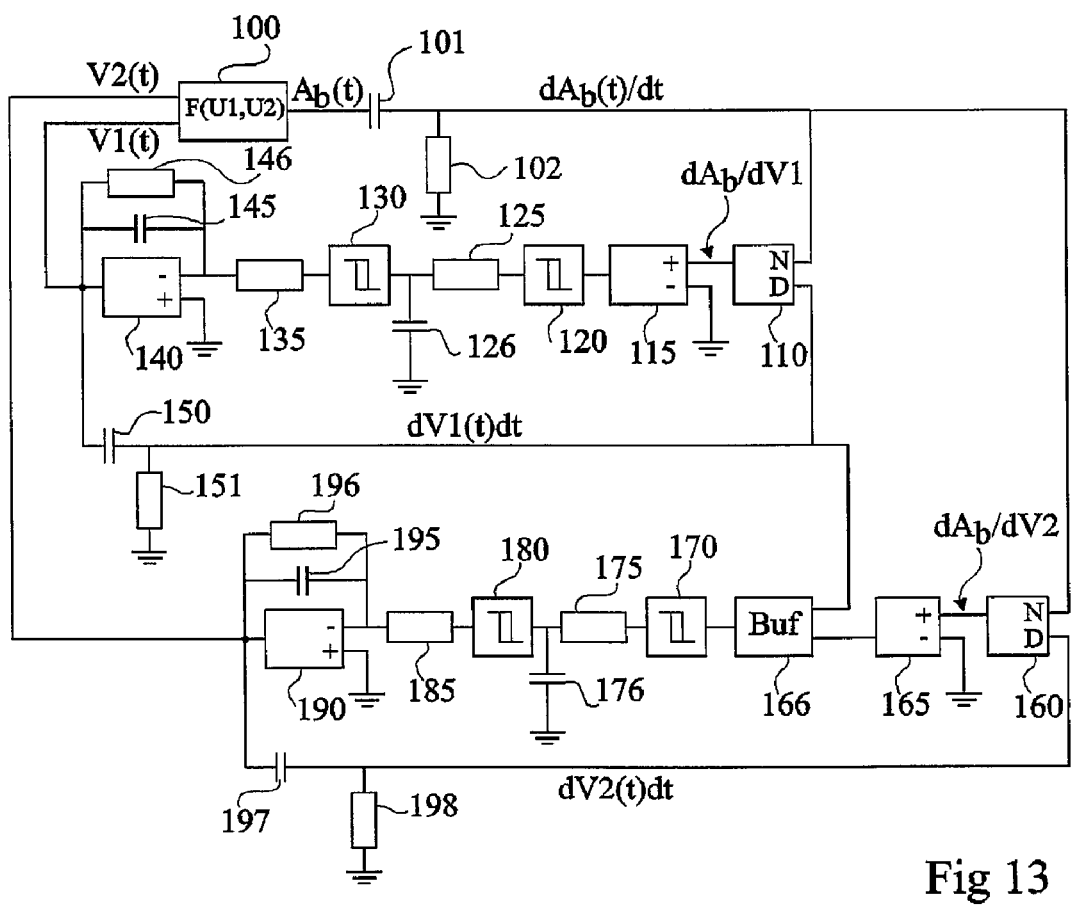
FIG. 13 is a more detailed diagram of the control system shown in FIG. 12.

FIG. 13 is a full diagram of control device 45. In addition to the elements described in relation with FIG. 12, it comprises the following elements. The intermediary node between capacitor 101 and resistor 102 is connected to a "numerator" input N of a dividing block 160. The output of dividing block 160 is connected to a positive terminal of a comparator block 165 having its negative terminal connected to ground. The output of comparator block 165 is connected to an input of a buffer device 166. Another input of buffer device 166 is connected to the intermediary node between capacitor 150 and resistor 151. The output of buffer device 166 is connected to a block of Schmitt trigger type 170. The output of block 170 is connected to a terminal of a resistor 175. A capacitor 176 is placed between the other terminal of resistor 175 and the ground. The intermediary node between resistor 175 and capacitor 176 is connected to the input of a block of Schmitt trigger type 180. The output of block 180 is connected to a terminal of a resistor 185. The other terminal of resistor 185 is connected to a negative input of an operational amplifier 190 having its positive input connected to ground. A capacitor 195 and a resistor 196 are placed in parallel between the output and the negative input of amplifier 190. The output of amplifier 190 provides voltage V2(t) which is applied in the charge element 30 included in block 100. The output of amplifier 190 is connected to an electrode of a capacitor 197. A resistor 198 is placed between the ground and the other electrode of capacitor 197. The intermediary node between capacitor 197 and resistor 198 is connected to a "denominator" input D of dividing block 160.

Buffer device 166 is provided to output a zero voltage when the value of dV1(t)/dt is non-zero, that is, as long as the setting of voltage V1 has not been completed, and a voltage substantially equal to the voltage provided by comparator block 165 when the setting of voltage V1 has been completed. The operation of the other elements, having reference numerals ranging between 160 and 198, is identical to the previously-described operation of the elements having reference numerals ranging between 110 and 151.

Figure 14:
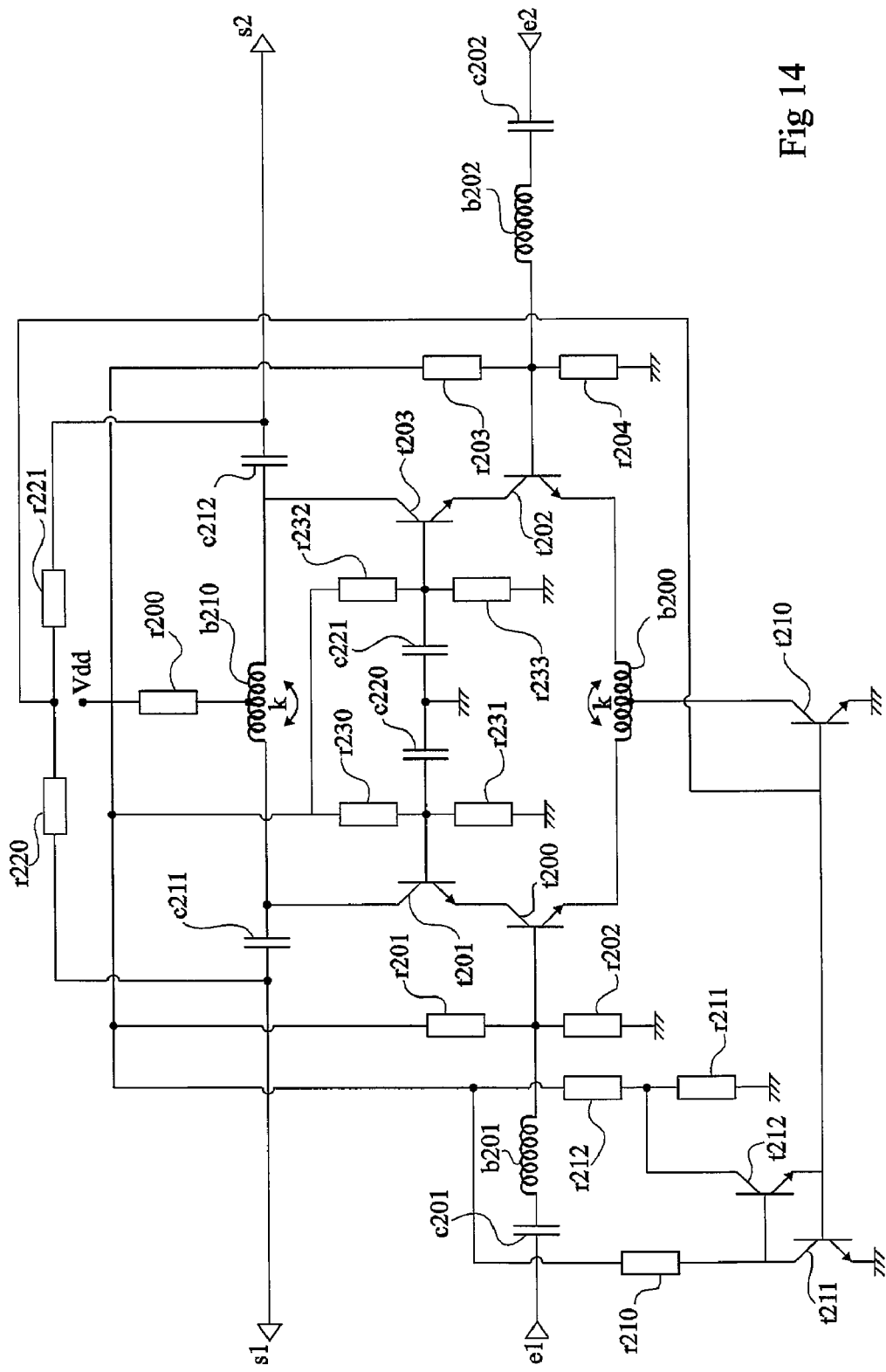
FIG. 14 is a diagram illustrating a first stage of a low-noise differential amplifier used in an example of a circulator according to the present invention.

FIG. 14 is a diagram of an input stage of a differential amplifier that can be used in a circulator according to the present invention. This first stage comprises two branches, each formed of a pair of cascode-assembled NPN-type bipolar transistors t200, t201, and t202, t203. The collector of transistor t200 is connected to the emitter of transistor t201 and the collector of transistor t202 is connected to the emitter of transistor t203. The emitters of transistors t200 and t202 are connected via a coil with a midpoint b200. The base of transistor t200 is connected to an input e1 of the amplifier via a coil b201 and a capacitor c201 is in series. Similarly, the base of transistor t202 is connected to an input e2 of the amplifier via a coil b202 and a capacitor c202 in series. The collector of transistor t201 is connected to an output s1 via a capacitor c211. Similarly, the collector of transistor t203 is connected to an output s2 via a capacitor c212. The collectors of transistors t201 and t203 are connected via a coil with a midpoint b210. A resistor r200 is placed between the midpoint of coil b210 and a supply voltage Vdd. Two resistors r201 and r202 are placed in series between voltage Vdd and the ground, the intermediary node between resistors r201 and r202 being connected to the base of transistor t200. Two resistors r203 and r204 are placed in series between voltage Vdd and the ground, the intermediary node between resistors r203 and r204 being connected to the base of transistor t202. The midpoint of coil b200 is connected to the collector of a transistor t210 having its emitter connected to ground. The base of transistor t210 is connected to the base of a transistor t211. The emitter of transistor t211 is grounded. The collector of transistor t211 is connected to the base of a transistor t212. The emitter of transistor t212 is connected to the base of transistor t211. A resistor r210 is placed between supply voltage Vdd and the collector of transistor t211. Two resistors r211 and r212 are placed in series between voltage Vdd and the ground. The intermediary node between resistors r211 and r212 is connected to the collector of transistor t212. Outputs s1 and s2 are connected by two resistors in series r220 and r221. The intermediary node between resistors r220 and r221 is connected to the base of transistor t210. A capacitor c220 is placed between the base of transistor t201 and the ground. Similarly, a capacitor c221 is placed between the base of transistor t203 and the ground. Two resistors r230 and r231 are placed in series between voltage Vdd and the ground, the intermediary node between resistors r230 and r231 being connected to the base of transistor t201. Similarly, two resistors r232 and r233 are placed in series between voltage Vdd and the ground, the intermediary node between resistors r232 and r233 being connected to the base of transistor t203.

In this first stage of the amplifier, transistors t210, t211, and t212, and resistors r210, r211, r212 form a current mirror. This current mirror forms a current source for the two main branches of the amplifier formed of transistor pairs t200/t201 and t202/t203. Capacitors c220, c221, and resistors r230 to r233 form a circuit for biasing the bases of transistors t201 and t203.

Further, resistors r220 and r221 and their connection with the base of transistor 210 form a device for regulating the value of the current provided by the current source supplying the two main branches. When signals identical in phase and in amplitude are received on inputs e1 and e2, for example, on reception of parasitic signals txa and txb, the current provided by the current source increases or decreases according to whether the power of the received signals is high or low.

The presence of the regulation device in the differential amplifier enables increasing its common-mode rejection factor (CMR). The detection and amplification capacities of the amplifier then are rather insensitive to parasitic signals txa and txb. On reception of an electromagnetic signal Rx, the amplifier can then detect and amplify differentiated signals rxa and rxb of very low power, without for the simultaneous transmission of an electromagnetic signal Tx of high power to disturb the amplifier operation.

An advantage of a circulator according to the present invention is that a terminal equipped with such a circulator can detect a much more distant transponder device without it being necessary for the transponder to have an internal battery.

As a non-limiting indication, a circulator according to the present invention enables transmitting an electromagnetic signal Tx having a power on the order of 30 mW (15 dBm), and simultaneously receiving an electromagnetic signal Rx having a minimum power on the order of 0.1 nW (−70 dBm).

Of course, the present invention is likely to have different variations and modifications which will occur to those skilled in the art. In particular, it will be within the abilities of those skilled in the art to devise other embodiments of a coupler. Further, other charge elements and other control circuits may be devised.

Further, couplers A, B and differential amplifier 31 of the circulator according to the present invention shown in FIG. 3 belong to a same integrated circuit, in other words, to a same monolithic device. Charge element 30, control device 45, and antenna 2 may belong to this same integrated circuit or be formed outside of this integrated circuit and be connected thereto.

The invention claimed is:

1. A monolithic circulator, intended to be connected to an antenna for transmitting and receiving high-frequency signals, comprising:
    a differential amplifier capable of providing a signal on an output of the circulator, said amplifier having a first and a second input and an output; and
    first and second 3 dB couplers, each of said first and second couplers comprising first, second, and third access terminals respectively, the second terminals of said first and second couplers being connected to an input of the circulator, the third terminals of said first and second couplers being connected to said first and second inputs of the amplifier respectively, the first terminals of said first and second couplers being respectively adapted to be connected to the antenna and to a charge element having an impedance close to that of the antenna.

2. The circulator of claim 1, wherein said first coupler comprises a first resistor and a first coil placed in parallel between said first and third terminals of said first coupler, said second coupler comprises a second resistor and a second coil placed in parallel between said first and third terminals of said second coupler, said first and second coils having first and second midpoints respectively, two parts of each of said first and second coils being magnetically coupled to one another, the first and second midpoints of said first and second coils being connected to the first terminals of said first and second couplers, respectively.

3. The circulator of claim 2, wherein said first coupler further comprises a first capacitor in parallel with the first resistor and the first coil and said second coupler further comprises a second capacitor in parallel with the second resistor and the second coil.

4. The circulator of claim 2, wherein the impedance of the antenna is close to that of a resistance of value R, the value of the resistances of each of said first and second couplers being approximately equal to four times R, the impedance of each of said first and second inputs of the differential amplifier being approximately equal to twice R, an output impedance of a circuit connected on the input of the circulator being approximately equal to twice R.

5. The circulator of claim 1, wherein the impedance of the charge element is settable.

6. The circulator of claim 5, comprising a control circuit capable of modifying the impedance of the charge element according to a voltage measured at the output of the differential amplifier.

7. The circulator of claim 5, wherein the charge element comprises:

first and second varactor-type diodes;
a first resistor and a first voltage source in series between the ground and a first intermediary node between the cathodes of said first and second varactor-type diodes;
third and fourth varactor-type diodes;
a second resistor and a second voltage source in series between the ground and a second intermediary node between the cathodes of said third and fourth varactor-type diodes,
wherein the anode of the first diode is grounded via a third resistor, the anode of the third diode is grounded, the fourth diode is grounded via a fourth resistor,
a coil placed between the anode of the second diode and the anode of the fourth diode.

8. The circulator of claim 7, comprising a control circuit adapted to modify the impedance of the charge element according to a voltage measured at the output of the differential amplifier, wherein the control circuit comprises a first block assembly which receives the output of the circulator and which is connected to first and second control loops, the first block assembly comprising a device for extracting the amplitude of the output signal of the circulator, followed by a low-pass filter and a differentiating device, each of said first and second control loops comprising the following elements: a dividing bridge receiving on a numerator input the output of the differentiating device, the output of the dividing bridge being connected to a positive terminal of a comparator the output of the comparator being connected to a stabilizing device having its output connected to the input of an integrating block, a differentiating block being placed between the output of the integrating block and a denominator input of the dividing block, the second loop further comprising a buffer block placed between its comparator and its stabilizing device and receiving the output of the differentiating block of the first loop, the output of the buffer block being equal to the output of the comparator of the second loop or to zero according to whether the output of the differentiating block of the first loop is respectively zero or non-zero, the outputs of the integrating blocks of the first and second loops respectively providing voltages equal to the voltages applied by the first and second voltage sources of the charge element.

9. The circulator of claim 8, wherein the differentiating device is formed of a capacitor and of a resistor in series placed between the output of the low-pass filter and the ground, the intermediary node between the capacitor and the resistor being connected to the numerator inputs of the dividing blocks of the control loops,
wherein the stabilizing device of each control loop comprises first and second Schmitt triggers, the input of the first trigger being connected to the comparator of the considered loop, a first resistor placed between the triggers, a capacitor placed between the input of the second trigger and the ground, and a second resistor placed between the output of the second trigger and the input of the integrating block of the considered control loop,
wherein the differentiating block of each control loop comprises a capacitor and a resistor in series between the input of the block and the ground, the intermediary node between the capacitor and the resistor forming the block output, and
wherein the integrating block of each control loop comprises a differential amplifier as well as a capacitor and a resistor placed in parallel between the output and the negative input of the differential amplifier, the positive and negative terminals of the amplifier being respectively connected to ground and to the output of the stabilizing device of the considered loop.

10. A terminal for receiving and transmitting electromagnetic signals comprising a circulator, said circulator circulate comprising:
a differential amplifier adapted to provide a signal on an output of the circulator, said amplifier having a first and a second input and an output; and
first and second 3dB couplers, each of said first and second couplers comprising first, second, and third access terminals respectively, the second terminals of said first and second couplers being connected to an input of the circulator, the third terminals of said first and second couplers being connected to said first and second inputs of the amplifier respectively, the first terminals of said first and second couplers being respectively intended to be connected to an antenna and to a charge element having an impedance close to that of the antenna, the circulator being connected to the antenna.

11. The terminal of claim 10, wherein said first coupler comprises a first resistor and a first coil placed in parallel between said first and third terminals of said first coupler, said second coupler comprises a second resistor and a second coil placed in parallel between said first and third terminals of said second coupler, said first and second coils having first and second midpoints respectively, two parts of each of said first and second coils being magnetically coupled to one another, the first and second midpoints of said first and second coils being connected to the first terminals of said first and second couplers, respectively.

12. The terminal of claim 11, wherein said first coupler further comprises a first capacitor in parallel with the first resistor and the first coil and said second coupler further comprises a second capacitor in parallel with the second resistor and the second coil.

13. The terminal of claim 11, wherein the impedance of the antenna is close to that of a resistance of value R, the value of the resistances of each of said first and second couplers being approximately equal to four times R, the impedance of each of said first and second inputs of the differential amplifier being approximately equal to twice R, an output impedance of a circuit connected on the input of the circulator being approximately equal to twice R.

14. The terminal of claim 10, wherein the impedance of the charge element is settable.

15. The terminal of claim 14, comprising a control circuit adapted to modify the impedance of the charge element according to a voltage measured at the output of the differential amplifier.

16. The terminal of claim 14, wherein the charge element comprises:
first and second varactor-type diodes;
a first resistor and a first voltage source in series between the ground and a first intermediary node between the cathodes of said first and second varactor-type diodes;
third and fourth varactor-type diodes;
a second resistor and a second voltage source in series between the ground and a second intermediary node between the cathodes of said third and fourth varactor-type diodes,
wherein the anode of the first diode is grounded via a third resistor, the anode of the third diode is grounded, the fourth diode is grounded via a fourth resistor,
a coil placed between the anode of the second diode and the anode of the fourth diode.

17. The terminal of claim 16, comprising a control circuit adapted to modify the impedance of the charge element according to a voltage measured at the output of the differential amplifier, wherein the control circuit comprises:

a first block assembly which receives the output of the circulator and which is connected to first and second control loops, the first block assembly comprising a device for extracting the amplitude of the output signal of the circulator, followed by a low-pass filter and a differentiating device, each of said first and second control loops comprising the following elements:

a dividing bridge receiving on a numerator input the output of the differentiating device, the output of the dividing bridge being connected to a positive terminal of a comparator, the output of the comparator being connected to a stabilizing device having its output connected to the input of an integrating block, a differentiating block being placed between the output of the integrating block and a denominator input of the dividing block, the second loop further comprising:

a buffer block placed between its comparator and its stabilizing device and receiving the output of the differentiating block of the first loop, the output of the buffer block being equal to the output of the comparator of the second loop or to zero according to whether the output of the differentiating block of the first loop is respectively zero or non-zero, the outputs of the integrating blocks of the first and second loops respectively providing voltages equal to the voltages applied by the first and second voltage sources of the charge element.

18. The terminal of claim 17, wherein the differentiating device is formed of a capacitor and of a resistor in series placed between the output of the low-pass filter and the ground, the intermediary node between the capacitor and the resistor being connected to the numerator inputs of the dividing blocks of the control loops, wherein the stabilizing device of each control loop comprises first and second Schmitt triggers, the input of the first trigger being connected to the comparator of the considered loop, a first resistor placed between the triggers, a capacitor placed between the input of the second trigger and the ground, and a second resistor placed between the output of the second trigger and the input of the integrating block of the considered control loop, wherein the differentiating block of each control loop comprises a capacitor and a resistor in series between the input of the block and the ground, the intermediary node between the capacitor and the resistor forming the block output, and wherein the integrating block of each control loop comprises a differential amplifier as well as a capacitor and a resistor placed in parallel between the output and the negative input of the differential amplifier, the positive and negative terminals of the amplifier being respectively connected to ground and to the output of the stabilizing device of the considered loop.

* * * * *